(12) United States Patent
Aalund et al.

(10) Patent No.: US 7,578,650 B2
(45) Date of Patent: Aug. 25, 2009

(54) QUICK SWAP LOAD PORT

(75) Inventors: Martin P. Aalund, Sunnyvale, CA (US); Ami Appelbaum, Saratoga, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 264 days.

(21) Appl. No.: 10/910,110

(22) Filed: Jul. 29, 2004

(65) Prior Publication Data
US 2006/0045662 A1 Mar. 2, 2006

(51) Int. Cl.
*H01L 21/677* (2006.01)
(52) U.S. Cl. ........................ 414/806; 414/217
(58) Field of Classification Search .............. 414/277, 414/222.07–222.09, 222.11, 222.12, 217, 414/217.1, 939, 940, 805
See application file for complete search history.

(56) References Cited

U.S. PATENT DOCUMENTS

| | | | | |
|---|---|---|---|---|
| 4,636,128 A | * | 1/1987 | Millis et al. | 414/217 |
| 5,431,600 A | * | 7/1995 | Murata et al. | 454/187 |
| 5,570,990 A | * | 11/1996 | Bonora et al. | 414/543 |
| 5,967,740 A | * | 10/1999 | Pflueger et al. | 414/749.6 |
| 6,009,890 A | * | 1/2000 | Kaneko et al. | 134/133 |
| 6,033,175 A | * | 3/2000 | Pflueger et al. | 414/401 |
| 6,042,623 A | * | 3/2000 | Edwards | 29/25.01 |
| 6,205,881 B1 | * | 3/2001 | Gravell et al. | 74/483 R |
| 6,234,788 B1 | | 5/2001 | Lee | 432/124 |
| 6,409,448 B1 | | 6/2002 | Sindledecker | 414/222.04 |
| 6,431,806 B1 | * | 8/2002 | Doche | 414/217 |
| 6,435,330 B1 | * | 8/2002 | Bonora et al. | 198/346.3 |
| 6,439,822 B1 | * | 8/2002 | Kimura et al. | 414/331.04 |
| 6,454,512 B1 | * | 9/2002 | Weiss | 414/663 |
| 6,468,021 B1 | * | 10/2002 | Bonora et al. | 414/522 |
| 6,473,996 B1 | | 11/2002 | Tokunaga | 34/417 |
| 6,481,558 B1 | * | 11/2002 | Bonora et al. | 198/346.2 |
| 6,551,049 B2 | * | 4/2003 | Gravell et al. | 414/539 |
| 6,572,321 B1 | | 6/2003 | Nulman | 414/416.05 |
| 6,582,174 B1 | * | 6/2003 | Hayashi | 414/217 |
| 6,612,797 B1 | * | 9/2003 | Bonora et al. | 414/217 |
| 6,726,429 B2 | * | 4/2004 | Sackett et al. | 414/217 |

(Continued)

OTHER PUBLICATIONS

Jaim Nulman "Using Process Tool Automation to Increase Efficiency and Productivity in 300 mm Factories" in *Semiconductor Fabtech*, 13th Edition, Mar. 2001, pp. 245-247, <http://www.fabtech.org/journals/edition.13/ft13.pdf/ft13_245.pdf>.

(Continued)

*Primary Examiner*—Charles A Fox
(74) *Attorney, Agent, or Firm*—Joshua D. Isenberg; JDI Patent

(57) ABSTRACT

Apparatus and method for reducing the load on an automated material handling system during processing of materials are disclosed. A materials processing tool with one or more load ports is equipped with at least one movable buffer attached to the tool front end. The buffer is configured to receive a materials pod from the automated material handling system at a storage location and move the pod to one or more of the one or more of the load ports and/or receive a pod from one or more of the one or more load ports and move the pod to the storage location. Any pod in the buffer is accessible either manually or by the material handling system.

51 Claims, 7 Drawing Sheets

U.S. PATENT DOCUMENTS

| | | | |
|---|---|---|---|
| 6,817,822 B2 | 11/2004 | Tokunaga | 414/217 |
| 6,981,832 B2 | 1/2006 | Zinger et al. | 414/217 |
| 7,066,707 B1 * | 6/2006 | Bonora et al. | 414/744.3 |
| 7,100,340 B2 * | 9/2006 | Bonora et al. | 52/729.5 |
| 7,101,138 B2 * | 9/2006 | Fosnight et al. | 414/222.11 |
| 7,108,121 B2 * | 9/2006 | Fujimura et al. | 198/347.1 |
| 2001/0043849 A1 | 11/2001 | Perlov et al. | 414/222.01 |
| 2001/0053324 A1 | 12/2001 | Saeki et al. | 414/936 |
| 2003/0113190 A1 | 6/2003 | Bachrach | 414/217 |
| 2004/0109746 A1 * | 6/2004 | Suzuki | 414/373 |
| 2005/0079041 A1 | 4/2005 | Campbell et al. | 414/626 |
| 2005/0135906 A1 * | 6/2005 | Fosnight et al. | 414/277 |
| 2006/0045663 A1 | 3/2006 | Aggarwal et al. | 414/217 |
| 2006/0051188 A1 * | 3/2006 | Hoshino | 414/277 |
| 2006/0222479 A1 * | 10/2006 | Shiwaku et al. | 414/267 |
| 2007/0081879 A1 | 4/2007 | Bonora et al. | 414/217 |

OTHER PUBLICATIONS

Merriam Webster Online Dictionary entry for "any" [online], [retrieved on Sep. 13, 2007], Retrieved from the Internet,<URL: http://www.m-w.com/any>.

Office Action for U.S. Appl. No. 11/167,539 dated Jan. 5, 2009, 12 pages.

Notice of Allowance and Fee(s) Due date Jun. 15, 2009 for U.S. Appl. No. 11/167,539.

* cited by examiner

QUICK SWAP LOAD PORT

FIELD OF THE INVENTION

This invention generally relates to materials processing and more particularly to reducing the load on an automated materials handling system during processing of materials.

BACKGROUND OF THE INVENTION

Modern semiconductor fabrication facilities (known as "fabs") use tools that can process multiple wafers. The wafers are typically delivered to a tool from a stocker. Currently semiconductor FABS are often not limited by tool performance, but due to the availability of front opening unified pods (FOUP) at the tools equipment front end module (EFEM). This can be due to several causes including not enough work in process (WIP) at the tool and insufficient transport capability or scheduling flexibility in the Automated Material Handling System (AMHS) or Overhead Track System (OHT). If a tool has all its load ports loaded the AMHS must remove a finished FOUP prior to dropping off a new FOUP for that location. This requires the AMHS or OHT to make multiple trips to the tool from the stocker. Utilizing localized storage can reduce this impact but not eliminate it.

There have been several attempts to deal with this problem. For example, often tools will be ordered with three or four load ports instead of two to try and reduce the burden on the AMHS/OHT during peak periods. This allows the tool to work on two FOUPS while the other load ports are being loaded or unloaded by the AMHS. Unfortunately, this solution is less than optimal due to increased size cost and complexity of the EFEM, larger fan filter unit and increased overall tool footprint in the FAB. In addition, it does not always reduce the number of moves required by unidirectional OHT cars. If the FOUP to be retrieved is not downstream from the drop-off locations, an additional car or an additional circuit of the OHT must be performed.

Furthermore, in the present state of the art, even if two OHT cars work in parallel, processing of FOUPs could still take longer due to scheduling delays. Most scheduling systems will not dispatch a car to retrieve a new FOUP from storage until the finished FOUP has been removed from the load port. For example, in a typical mode of operation, a first OHT car is dispatched to a tool that has completed processing a FOUP. The first car collects the finished FOUP and delivers it to storage or another tool, after which the first car is free for the next task. After the first car has picked up the finished FOUP, the tool is available for a new FOUP and a second car is dispatched with a new FOUP. The second car unloads the FOUP at a load port of the tool. The second car is then available for the next task.

Other prior art solutions have attempted to provide some sort of local storage for FOUPs at or near the tool. For example, the Brooks OneFab™ AMHS provide storages e.g., shelves, in area under the OHT near the tool to store one or more FOUPs until the tool or AMHS/OHT becomes available. Although this reduces the time to move the FOUP from the Stocker it does not reduce the burden on the OHT. For example, the OHT must move the FOUPs between the tool front end and the shelves. Furthermore, FOUPs stored on the shelves are not easily accessible for manual hot lots or if the OHT goes down. A further drawback is that the AMHS must know in advance which tool and will be ready next. If the FOUP is stored at localized storage that is in another bay or area of the FAB significant delay may be incurred due to the added required travel. In extreme cases this could require handling by both intrabay and interbay OHT.

Another prior art approach has been to integrate a mini stocker into the tool front end. This approach allows several FOUPs to be stored onto the tool. The mini stocker typically includes one or more drop-off locations and a gantry robot for moving the FOUPs to and from the load ports on the tool front end. Mini-stocker systems can be dedicated to one tool as in Applied Materials Bay Distributed Stocker®, or span several tools as in Asyst's FasTrack®. For systems of this type, the OHT delivers FOUPS to the stocker, and the stocker transports the FOUPS to the load port. In the case of the Bay Distributed Stocker®, an integrated Gantry stores and places FOUPs on load ports that are mounted to the tool. Integrated mini-stockers are both expensive and complex. They also present a single point of failure for the system and do not readily allow for manual removal of FOUPs. Furthermore, an integrated mini-stocker can take up additional footprint on the floor of the fab. This is particularly disadvantageous in manufacturing environments where floor space is at a premium.

Another prior art approach is to add a standalone stocker to the EFEM. An example of such a system is available from Vertical Solutions. This type of system uses a form of gantry to place and retrieve FOUPs directly from a single load port. The OHT delivers FOUPS to the stocker, and the stocker transports the FOUPS to the load port. Like the integrated mini-stocker, the standalone stocker is both expensive, complex and a single point of failure. In addition, standalone stockers do not readily allow for manual removal of the FOUPs. The standalone stocker also takes up additional footprint on the floor of the fab. Furthermore, standalone stockers do not effectively reduce the burden on the OHT system. The AMHS would need prior knowledge of what tool or bay would have an available load port next. Current tools only signal completion. They do not inform the AMHS that they are on the last wafer, or a significant percent complete.

Thus, there is a need in the art, for a method for reducing the load on an automated material handling system during processing of materials that overcomes these disadvantages and an apparatus for implementing such a method.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

The inventors have recognized that a wafer processing system does not need four (or more load ports. Instead, by providing additional storage and the ability to drop off FOUPs to a tool or pick them up from the tool while additional FOUPs are being processed tool efficiency can be enhanced.

According to an embodiment of the present invention, a load port design allows a new FOUP to be lowed to the load-port prior to the completed FOUP being removed. This localized buffering or swapping can be accomplished with a variety of motions including but not limited to linear (e.g., horizontal or vertical) motion or rotational motion. The load port includes a quick swap buffer (QSB) that can be optimized for compatibility with both unidirectional and bi-directional systems. The QSB allows on OHT car to rapidly swap a finished FOUP with a new FOUP on a tool. With this approach, the AMHS would be signaled that the drop-off location is available as soon as the tool has completed processing, or when the load port has moved the FOUP to the local storage. This allows the same car to drop off a new FOUP and then immediately (or almost immediately) retrieve the completed one. This can drastically reduce or even eliminate the wait time for the tool. In addition, the loading of the OHT can be significantly reduced for both motion and scheduling, thus reducing traffic in the FAB.

Figure 1A:
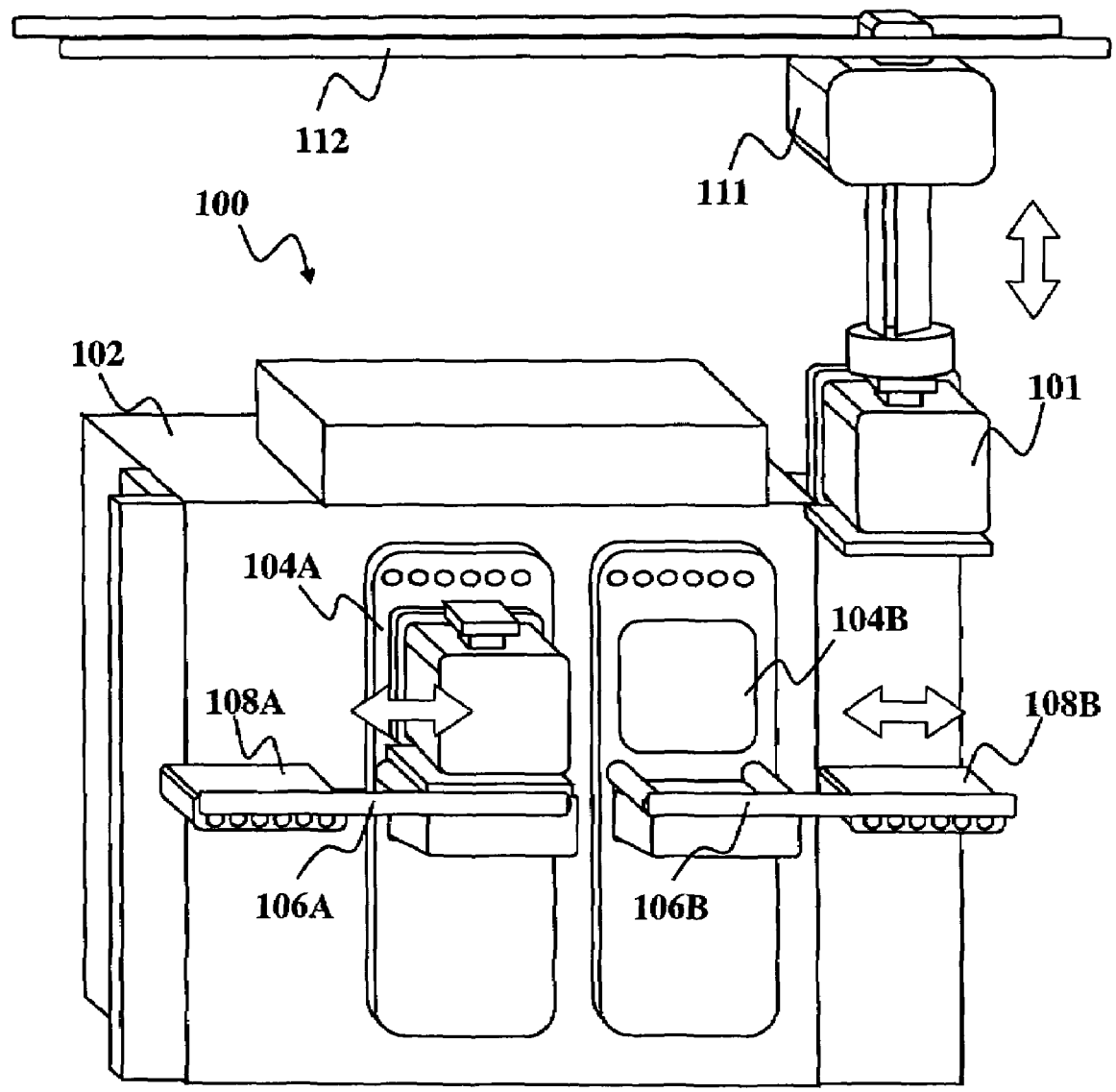
FIG. 1A is a schematic diagram of a materials processing system having a dual port tool according to an embodiment of the present invention.
Figure 1B:
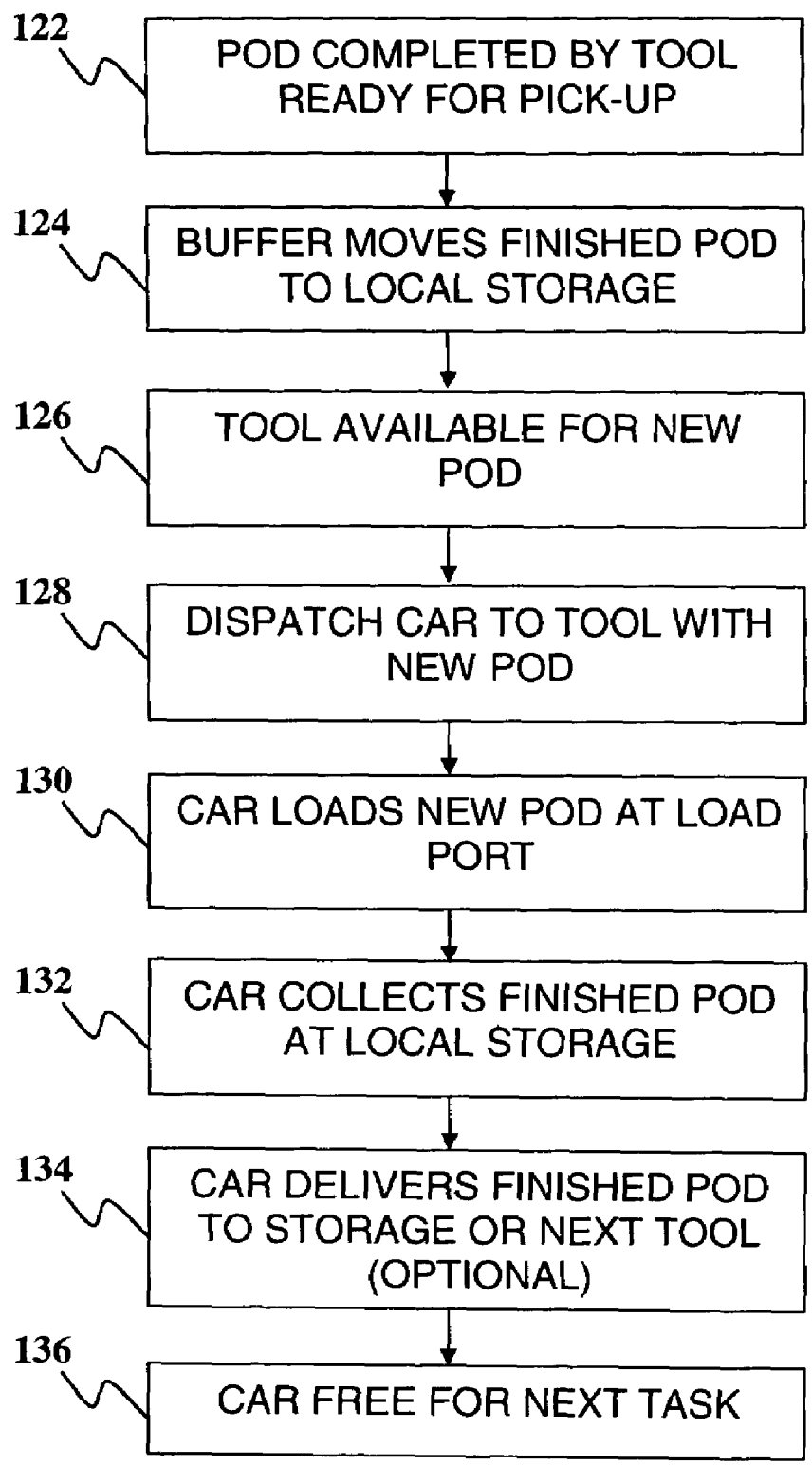
FIG. 1B is a flow diagram illustrating a method for reducing the load on an automated material handling system during processing of materials in a system of the type shown in FIG. 1A according to an embodiment of the present invention. If the finished pod is downstream of the buffer, the new pod could be dropped to the storage location, the new pod retrieved and then the buffer moves pod from storage to the load port.

FIGS. 1A and 1B illustrate examples of how embodiments of the present invention may be used to reduce the demands on a materials handling system during materials processing. As shown in FIG. 1A a materials processing system may include a materials processing apparatus 100 and materials handling system, e.g., in the form of an overhead track (OHT) 112 and one or more cars 111. The apparatus 100 includes a materials processing tool 102 having a front end with one or more load ports 104A, 104B and one or more movable buffers 106A, 106B attached to the front end of the tool 102. Each buffer 106A, 106B is configured to receive a materials pod 101 from the automated material handling system at a storage location 108A, 108B and move the pod 101 to one or more of the one or more of the load ports 104A, 104B. Each buffer 106A, 106B may be additionally or alternatively configured to receive a pod 101 from one or more of the one or more load ports 104A, 104B and move the pod 101 to the storage location 108A, 108B. In addition, any pod 101 in the buffers 106A, 106B or at one of the storage locations 108A, 108B is accessible either manually or by the material handling system.

The materials processing tool 102 may be a wafer-processing tool, e.g., of a type used in semiconductor wafer fabrication. Embodiments of the present invention are particularly applicable to tools that have a high throughput of wafer pods. Examples of such tools include metrology tools. This is particularly important during tool qualification. This can occur on a process change, no recipe or shift change. Example tools would be SP1, SP2, (wafer surface inspection) and F5X (thin film metrology) from KLA Tencor of Milpitas, Calif. By way of example, the materials pod 101 may be a front opening unified pod (FOUP) of a type commonly used in semiconductor fabrication. A commonly available FOUP can carry a stack of twenty-five 300-mm diameter wafers. A metrology tool may sample only three of the wafers in the FOUP.

The buffers 106A, 106B reduce the load on the materials handling system by providing both local storage and the ability to move the pods 101 between the load ports 104A, 104B and local storage at the storage locations 108A, 108B. According to another embodiment of the invention, the apparatus 100 may be used to reduce the load on the automated material handling system having one or more cars for deliver materials pods to one or more materials processing tools during processing of materials. The flow diagram shown in FIG. 1B illustrates an example of the steps of the method. The advantages of the apparatus of FIG. 1A can be readily understood by simultaneously referring to FIG. 1A and the flow diagram of FIG. 1B.

At step 122, the tool 100 has completed processing of a pod 101 and the pod is ready for pick-up. At step 124 the buffer 106A moves the finished pod from a load port 104A of the tool 100 to local storage at the storage location 108A proximate the load port 104A using the buffer 106A attached to a front end of the tool. The tool 100 is now available to receive a new pod at step 126. The OHT car 111 is dispatched with a new materials pod at step 128 and delivers the new materials pod to the load port 104A at step 130. Note that at this point, the car 111 is at the tool and free to pick up the finished pod 101. At step 130 the car 111 collects the finished pod 101 from local storage at the storage location 108A. At step 134 the car 111 may optionally deliver the finished pod 101 to storage (not shown) or to another tool. The car 111 is then free for the next task at step 136.

Note that in a unidirectional materials handling system, if the storage location 108A is located down stream of the load port 104A, the buffer 106A can move a finished pod 101 from the load port 104A to the storage location 108A. The car 111 can subsequently drop off a new pod at the load port 104A and then almost immediately afterwards pick up the finished pod 101 at the storage location 108A without having to change direction. On the other hand, if the storage location 108B may be located upstream of the load port 104B. When the tool 102 finishes processing a pod 101 the car 111 can drop off a new pod at the storage location 108B and then almost immediately afterwards pick up the finished pod at the load port 104B. The buffer 106B can then move the new pod to the load port 104B.

Even with bi-directional OHT cars, the buffers 106A, 106B can greatly reduce the load on the materials handling system since they can both locally store and move the pods 101. In a conventional local storage system, by contrast, the materials handling system must move the pods from the load ports to the local storage and vice versa.

The buffers 106A, 106B may be configured to move the pod by translating the pod 101. In the embodiment depicted in FIG. 1A, the buffers 106A, 106B may each include a translating mechanism configured to translate the pods 101 horizontally between a load port 104A, 104B and a storage location 108A, 108B located to a side of the load port. Such a translating mechanism may be implemented by a simple conveyor belt, track mechanism or a motorized cart running on tracks. By way of example the translating mechanism may include conveyers with integrated lift mechanisms to raise the pods 101 off the pins.

The buffers 106A, 106B may optionally be configured to provide information about the pods 101 to a system controller (not shown). This capability could allow the system controller to know, e.g., whether a particular pod was located one of the storage locations 108A, 108B and ready for pick-up. Such a capability may be implemented, by a POS ID system with a tag on the pods 101 and a tag reader at one or more of the storage locations 108A, 108B. The POS ID system may be either fixed or moveable. By way of example, bar code reader on the buffers 106A, 106B may read bar codes on the pods 101. Alternatively, magnetic stripe readers on the buffers 106A, 106B may read magnetic stripes on the pods 101.

Figure 2:
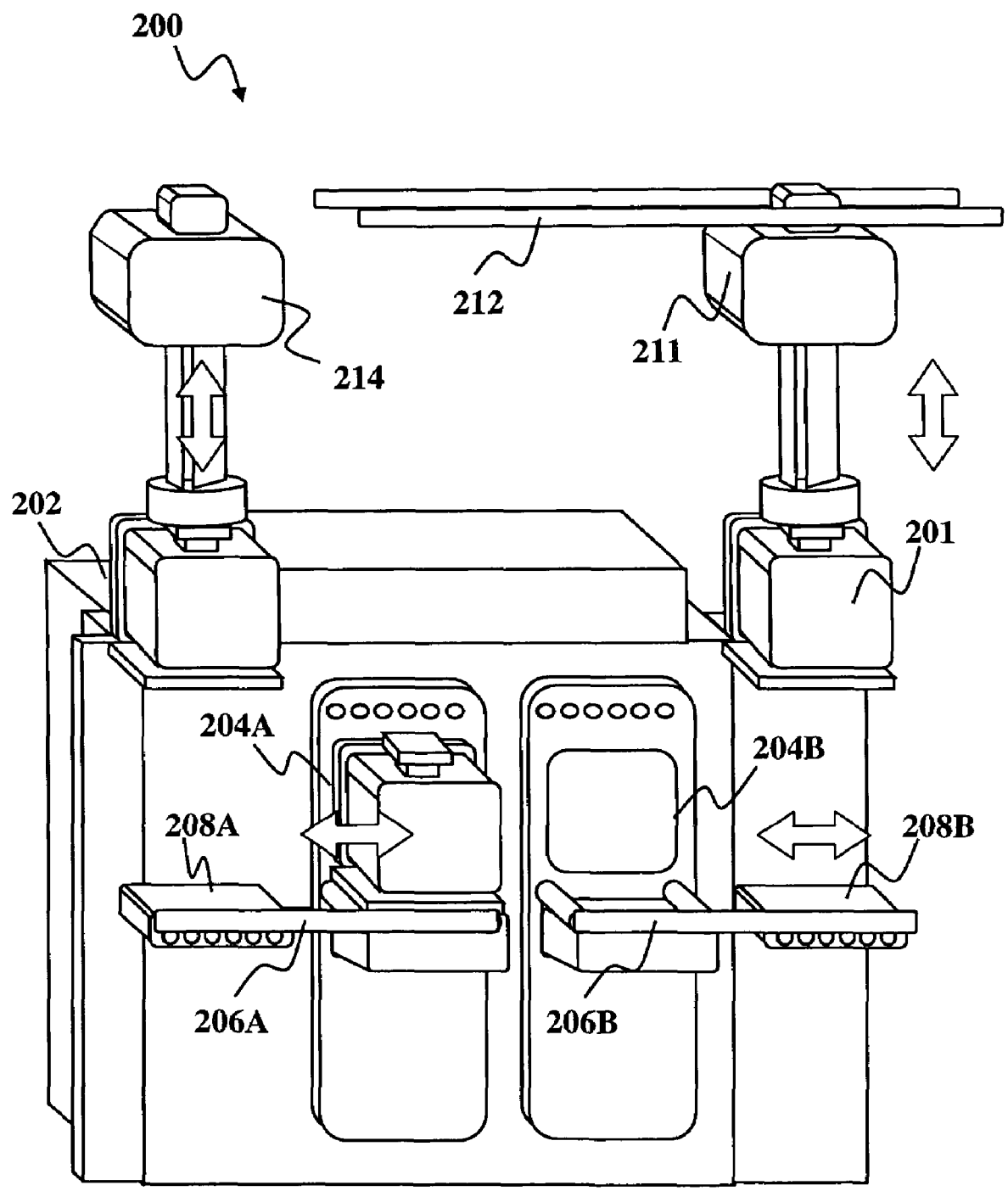
FIG. 2 is a schematic diagram of a materials processing system having a dual port tool and buffer with a vertical lift according to an alternative embodiment of the present invention.

Although FIG. 1A depicts a tool having buffer mechanisms that horizontally translate the pods, other buffer mechanisms may be used. For example, FIG. 2 depicts an apparatus 200 that is a variation on the apparatus of FIG. 1A. Like the Apparatus 100 of FIG. 1A, the apparatus 200 of FIG. 2B includes a materials processing tool 202 with one or more load ports 204A, 204B and one or more movable buffers 206A, 206B attached to the front end of the tool 202. The buffers 206A, 206B move materials pods 201 between storage locations 208A, 208B and the load ports 204A, 204B. Any pod 201 on the buffers 206A, 206B or at one of the storage locations 208A, 208B is accessible either manually or by the material handling system. The buffers 206A, 206B may include horizontal translation mechanisms as described above. Furthermore, at least one buffer 206A further includes a lift 214 that can translate a pod vertically. By way of example, the lift 214 may be an overhead lift, having a lift mechanism similar to that of an OHT car. The lift 214 provides the apparatus 200 with the ability to store two pods 201 at the storage location 208A, thereby increasing the number of pods the tool 202 can handle while still reducing the usage of the materials handling system, e.g., cars 211 on an overhead track 212. The vertical lift 214 also allows the buffers 206A, 206B to free the storage locations 208A, 208B for finished pods if the tool 202 completes an additional pod before the first completed pod can be collected.

Figure 3:
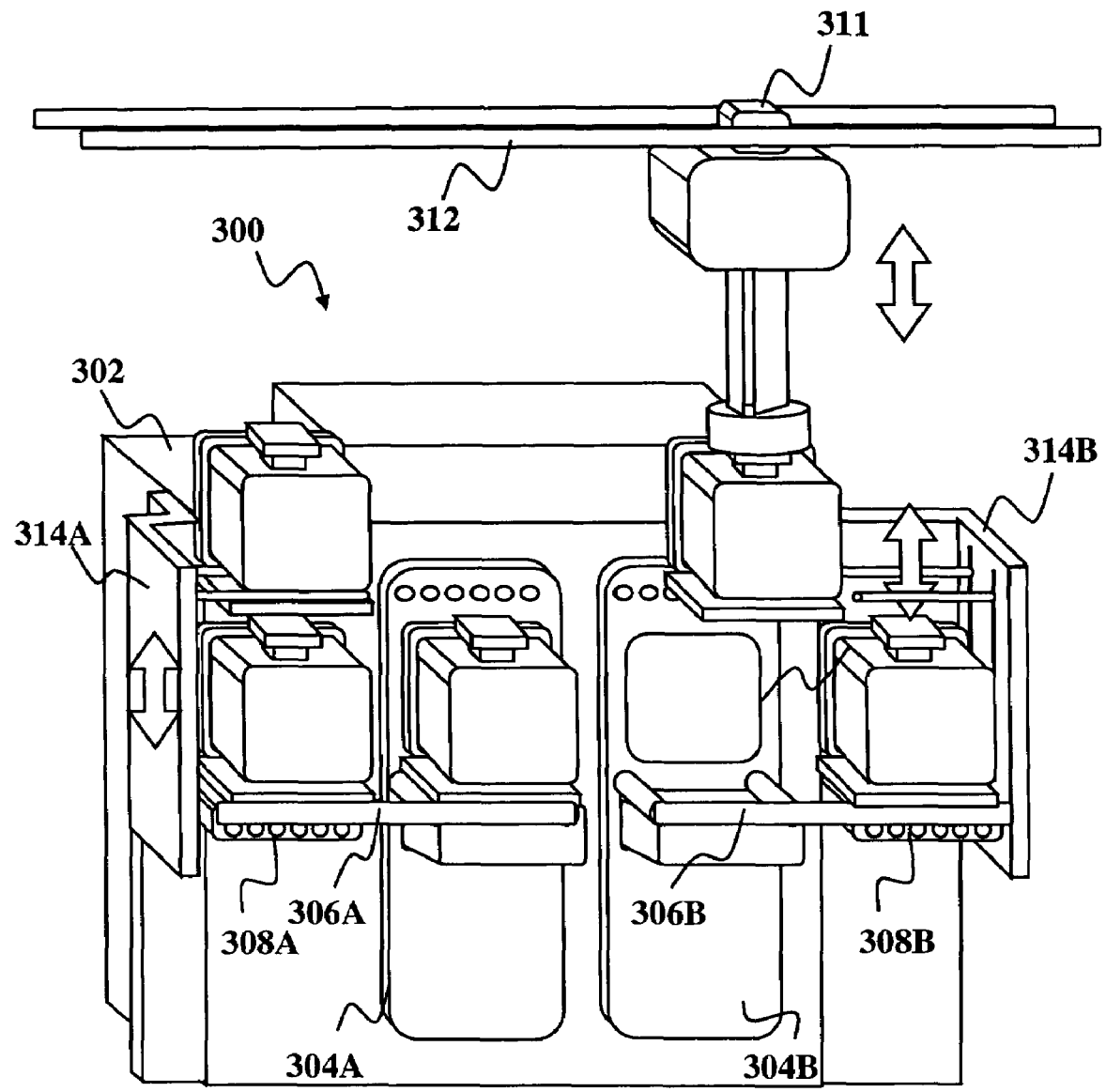
FIG. 3 is a schematic diagram of a materials processing system having a dual port tool according to another alternative embodiment of the present invention.

FIG. 3 depicts a variation on the apparatus 200 of FIG. 2. In FIG. 3, an apparatus 300 includes a materials processing tool 302 with load ports 304A, 304B and movable buffers 306A, 306B as described above. The buffers 306A, 306B move materials pods 301 between first storage locations 308A, 308B and the load ports 304A, 304B. The buffers 306A, 306B include horizontal translation mechanisms as described above. In addition, each buffer, 306A, 306B further includes a lift 314A, 314B configured to translate a pod vertically between the first storage locations 308A, 308B and a second storage location located above or below the first storage location. By way of example, the lifts 314A, 314B may be forklift type mechanisms. Note that in the embodiment of FIG. 3, even in the second storage location, the pods 301 are accessible by the materials handling system, e.g., an OHT car 311 running on tracks 312.

Figure 4:
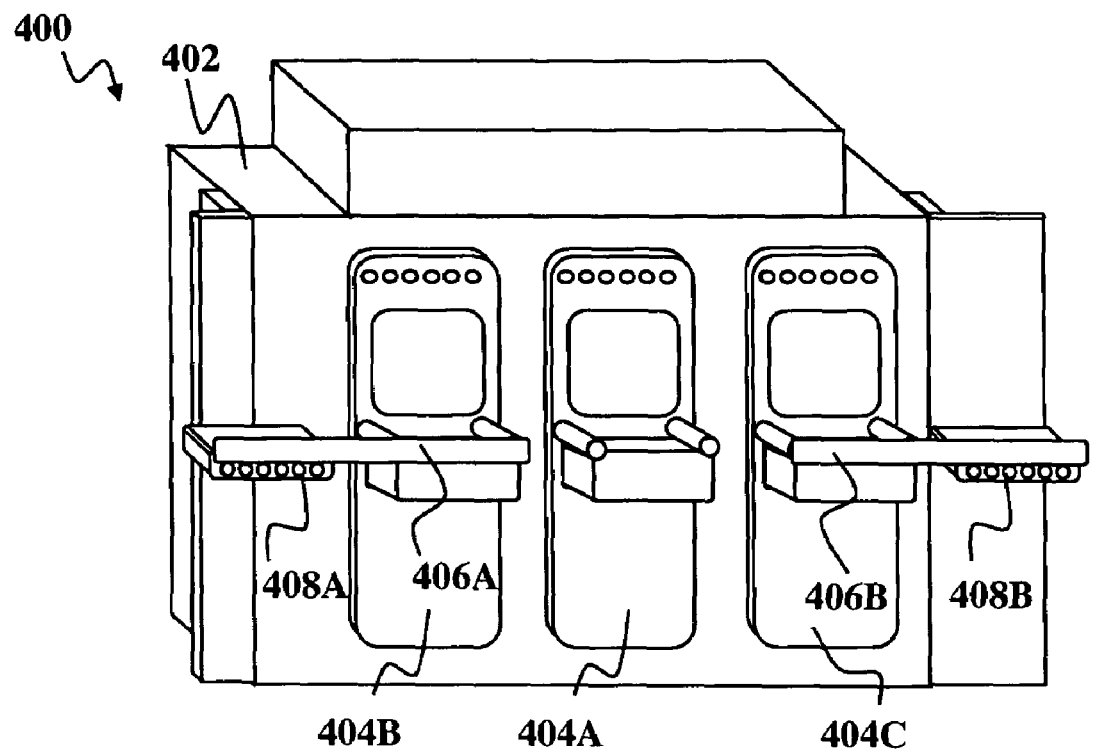
FIG. 4 is a schematic diagram of a three-port tool according to an alternative embodiment of the present invention.
Figure 5:
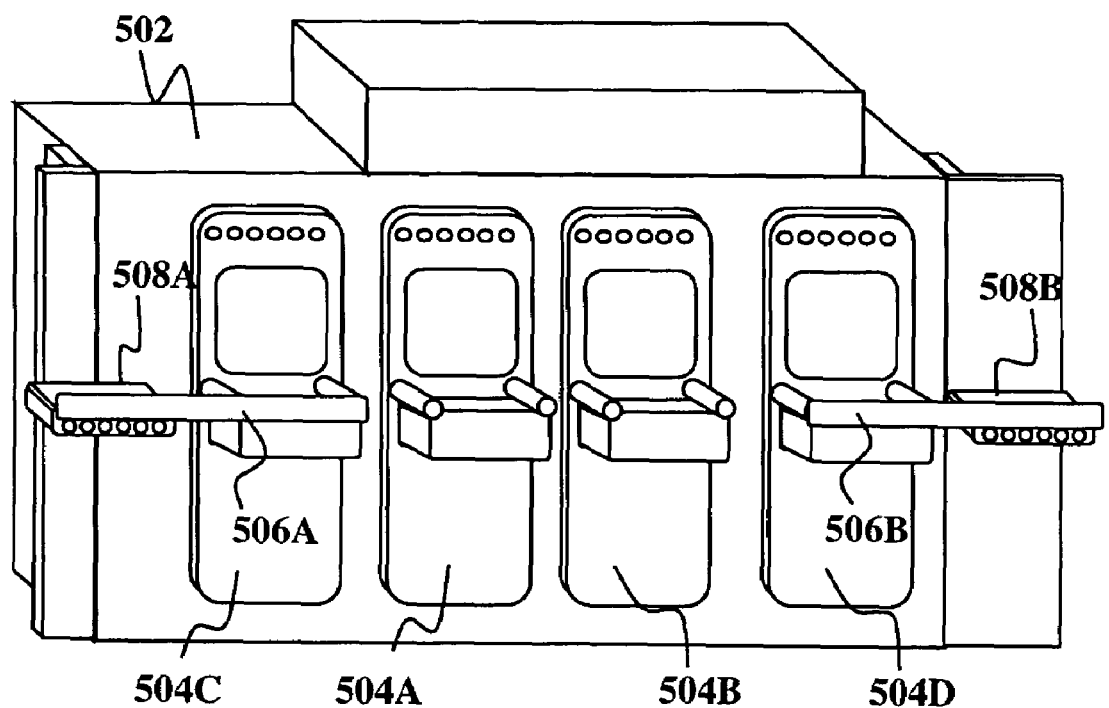
FIG. 5 is a schematic diagram four-port tool according to an alternative embodiment of the present invention.

Although FIG. 1A and FIGS. 2-3 depict tools having two or more load ports side-by-side, other tool configurations may be used with embodiments of the invention. For example, the tool includes three or more load ports side-by-side. FIG. 4 depicts a tool 402 with a first load port 404A situated between second and third load ports 404B, 404C and movable buffers 406A, 406B respectively located adjacent the second and third load ports. The first (middle) load port 404A may operate in a conventional manner while the second and third load ports 404B, 404C may operate as described above using the buffers to move pods between the two outer load ports 404B, 404C and the corresponding storage locations 408A, 408B. This concept may be extended to tools having more than three load ports. For example, FIG. 5 depicts a tool 502, having four load ports 504A, 504B, 504C, 504D. In the tool 502, two conventional load ports 504A, 504B are located between outer load ports 540C, 504D that are fitted with moveable buffers 506A, 506B. The two inner load ports 504A, 504B may operate in a conventional manner while the buffers 506A, 506B may move pods between the two outer load ports 504C, 504D and the corresponding storage locations 508A, 508B.

Embodiments of the present invention are not limited to apparatus using buffers that translate the pods horizontally or vertically. In addition, the movable buffers may impart some form of rotational motion to the pods. For example, in an apparatus of the type depicted in FIG. 1A, the buffers 106A, 106B may move the pods 101 from the load ports 104A, 104B to the storage locations 108A, 108B by rotating the pod through an arc, e.g., in a substantially horizontal or vertical plane.

Figure 6:
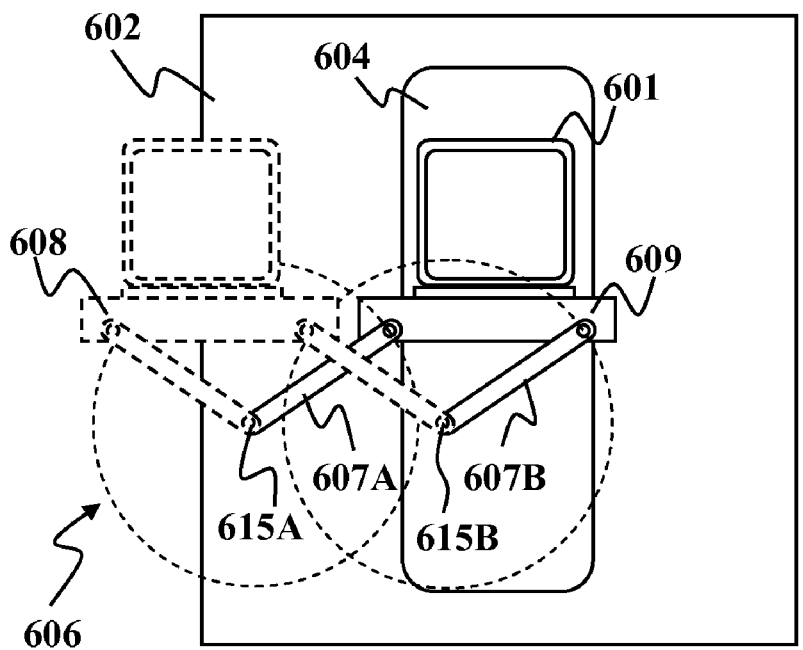
FIG. 6 is a front elevation schematic of a materials processing tool with a rotating buffer mechanism according to an embodiment of the invention.

In certain situations, it is desirable to impart a rotational movement to the pod while maintaining the pod in a substantially level orientation. This is particularly true where the rotational motion includes a substantially vertical component. According to an alternative embodiment of the invention the buffer may be configured to maintain the pod in a substantially level orientation during the rotational motion. For example, FIG. 6 depicts a materials processing tool 602 with a rotating buffer mechanism 606. For the sake of simplicity, the processing tool 602 is depicted as having a single load port 604. However, the concept may be extended to tools having two or more load ports. The buffer mechanism 606 includes a pod carrier 609 and two or more pivot arms 607A, 607B. The pivot arms 607A, 607B are pivotally attached at one end to the pod carrier 609 and pivotally attached to pivot points 615A, 615B at another end. The pivot points 615A, 615B are in a substantially fixed position with respect to the load port 604. For the sake of simplicity only two pivot arms are shown. Practical implementations may employ two parallel pairs of pivot arms arranged on opposite sides of the pod carrier 609. The pivot arms 607A, 607B, pod carrier 609 and pivot points 615A, 615B are arranged such that the pivot arms remain substantially parallel to each other as they rotate. Specifically, at some orientation, the points of pivotal attachment (i.e., then pivot points 615A, 615B and the points where the pivot arms 607A, 607B pivotally attach to the pod carrier 609) are at the corners of a parallelogram. When the pivot arms rotate in tandem the pod carrier 609 keeps a pod 601 level while moving from the load port 604 to a storage location 608.

Figure 7:
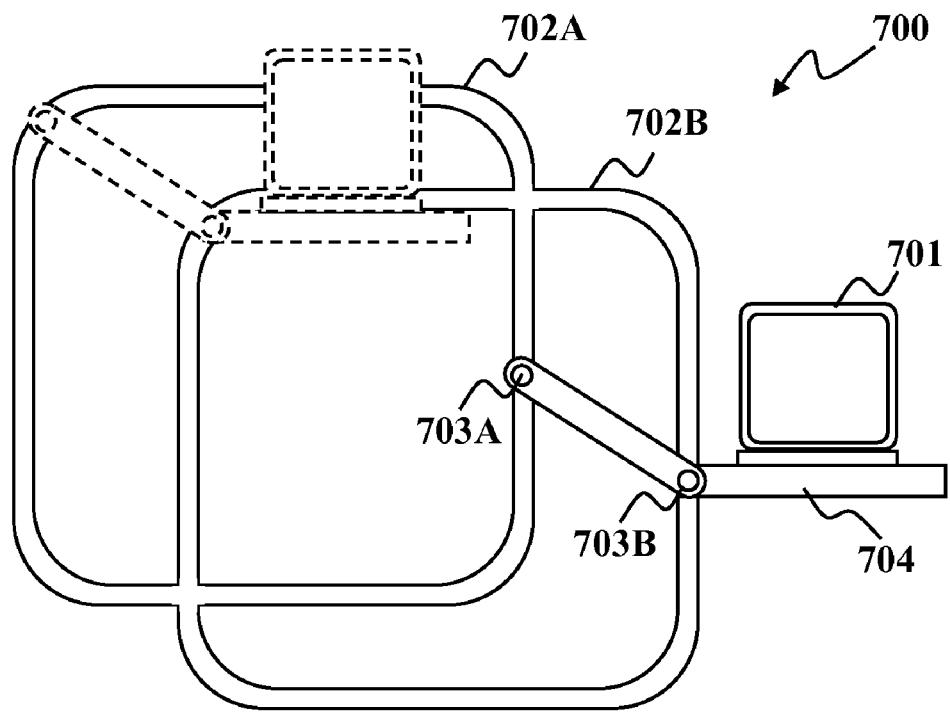
FIG. 7 is a front elevation schematic of an alternative rotating buffer mechanism.

FIG. 7 illustrates an alternative design for a rotating buffer mechanism 700, which may be used instead of the mechanism 606 of FIG. 6. The buffer mechanism 700 the buffer includes a pod carrier 704 and two or more tracks, e.g., first and second tracks 702A, 702B. The first and second tracks 702A, 702B respectively follow first and second paths having substantially the same shape. In the example depicted in FIG. 7, each track is in the shape of a rectangle having rounded corners. The pod carrier 704 includes two or more bearings 703A, 703B that are in a substantially fixed positional relation with respect to each other. Each bearing is adapted to ride in a different one of the first and second tracks. As shown in FIG. 7, the first and second paths are oriented substantially parallel to each other yet offset with respect to each other such that the pod carrier 704 remains substantially level as it rides along the tracks.

Figure 8:
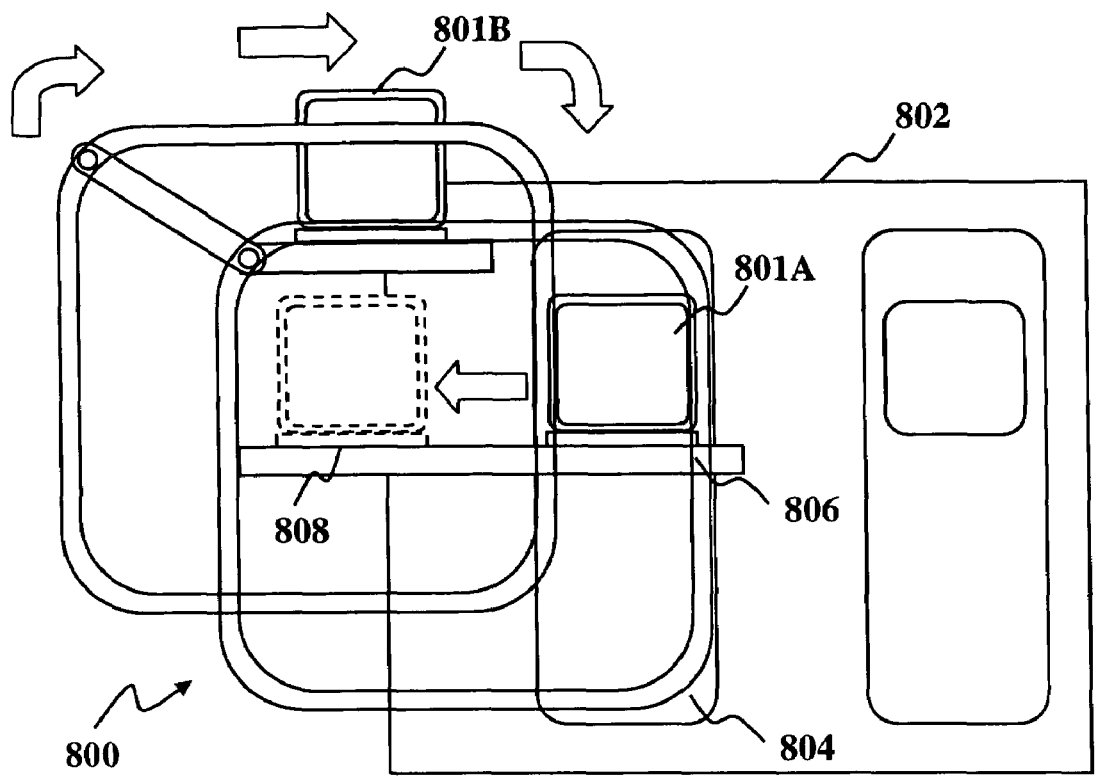
FIG. 8 is a front elevation schematic of a dual load port tool with a swap buffer according to an embodiment of the present invention.

According to another alternative embodiment, buffers may be configured to simultaneously swap a first pod and second pod between a storage location proximate the front end of the tool and one of the load ports. This is particularly advantageous in reducing the burden on the materials handling system. For example, an OHT car can place a new pod at the tool before the tool finishes processing another pod. If the buffer can swap the pods between the load port and storage location, an OHT car can be available for other tasks as soon as it drops off a pod. Mechanisms of the types depicted in FIGS. 6-7 are particularly useful in this context. For example, FIG. 8 depicts a tool 802 having a load port 804 and a swap buffer 800 that includes a mechanism of the type depicted in FIG. 7, e.g., having carrier that rides on bearings along first and second offset tracks. The buffer mechanism 800 further includes a simple horizontal translation mechanism 806. The first pod carrier can move a first pod 801A along the tracks while the translation mechanism 806 moves a second pod 801B underneath (or above) the first pod 801A. In this manner, the buffer mechanism can simultaneously (or nearly simultaneously) swap the first and second pods between the load port 804 and a storage location 808.

Figure 9:
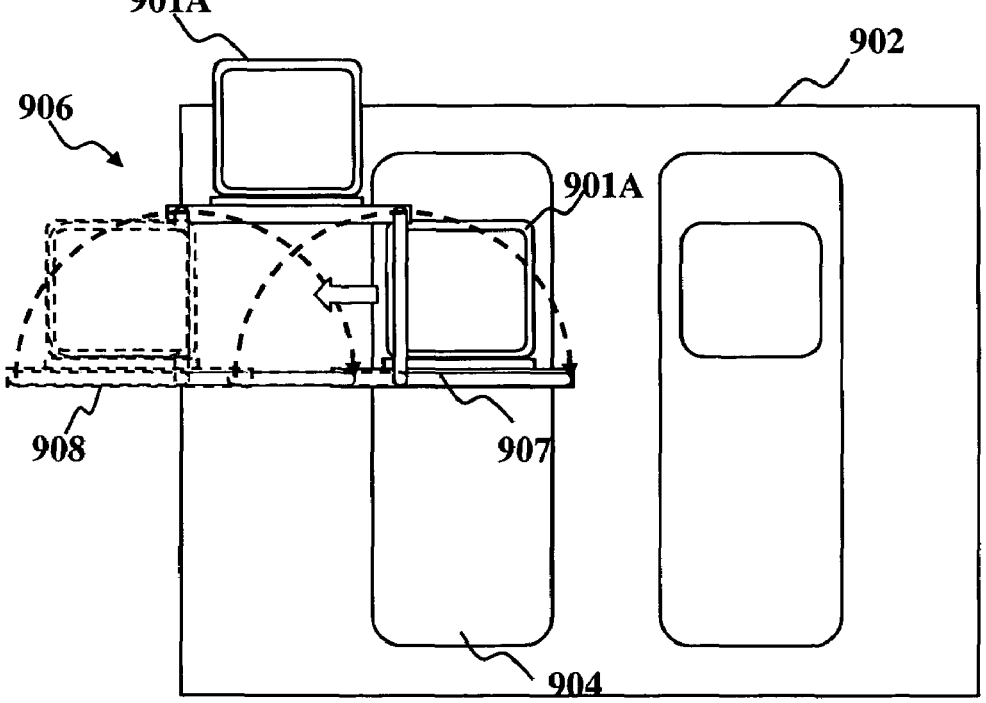
FIG. 9 is a front elevation schematic of a dual load port tool with an alternative swap buffer according to an embodiment of the present invention.

As an alternative, a mechanism of the type depicted in FIG. 6 may be used to swap two pods. For example, FIG. 9 depicts a tool 902 having one or more load ports 904 and a swap buffer 906 having a pod carrier and two or more pivot arms configured as described above with respect to FIG. 6. The swap buffer further includes a simple horizontal translation mechanism 907 that translates a first pod 901A between the load port 904 and a storage location 908. The pod carrier and pivot arms rotate a second pod above (or below) the first pod so that the first and second pods can be simultaneously (or nearly simultaneously) swapped between the load port and storage location or vice versa.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An apparatus for reducing the load on an automated material handling system during processing of materials, comprising:
a materials processing tool having a front end with one or more load ports and one or more storage locations adapted to receive a materials pod from the automated material handling system, wherein each of the one or more storage locations is level with a corresponding one of the one or more load ports, and wherein each of the one or more storage locations is arranged in line abreast with a corresponding one of the one or more load ports; and at least one movable buffer attached to the front end, wherein the buffer comprises a translating mechanism, wherein the buffer is configured to move a materials pod from one of the one or more of the storage locations to a corresponding one of the one or more load ports by direct translation parallel to the front end, and/or wherein the buffer is configured to receive a pod from the one of the one or more load ports and move the pod to the corresponding one of the one or more of the storage locations by direct translation parallel to the front end,
wherein the buffer is configured to support a pod on the buffer from below and allow access to the pod by the material handling system during translation, and wherein each of the one or more storage locations at the front end is configured to support a pod from below and wherein each of the one or more storage locations is configured such that a pod at any of the one or more storage locations is accessible by the material handling system without having to move the pod with the buffer.

2. The apparatus of claim 1 wherein the translating mechanism is configured to translate a pod horizontally between a load port and a storage location located to a side of the load port.

3. The apparatus of claim 1 wherein the buffer is configured to move the pod by a rotational motion of the pod.

4. The apparatus of claim 3 wherein the buffer is configured to maintain the pod in a substantially level orientation during the rotational motion of the pod.

5. The apparatus of claim 4 wherein the buffer includes a pod carrier and two or more pivot arms, wherein each pivot arm is pivotally attached at a first end to the pod carrier and pivotally attached at a second end to a pivot point, wherein the pivot points are located such that the pivot arms remain substantially parallel to each other as they rotate.

6. The apparatus of claim 4 wherein the buffer includes a pod carrier and two or more tracks, wherein the two or more tracks include first and second tracks, wherein the first and second tracks respectively follow first and second substantially co-planar paths having substantially the same shape, wherein the pod carrier includes two or more bearings, the bearings being in a substantially fixed positional relation with respect to each other, each bearing being adapted to ride in a different one of the first and second tracks, wherein the first and second paths are offset with respect to each other, whereby the pod carrier is constrained to ride along the tracks such that the pod carrier remains substantially level as it rides along the tracks.

7. The apparatus of claim 4 wherein the buffer includes a pod carrier and two or more tracks, wherein the two or more tracks include first and second tracks, wherein the first and second tracks respectively follow first and second substantially co-planar intersecting closed-loop paths having substantially the same shape, wherein the pod carrier includes two or more bearings, the bearings being in a substantially fixed positional relation with respect to each other, each bearing being adapted to ride in a different one of the first and second tracks, wherein the first and second paths are offset with respect to each other, whereby the pod carrier is constrained to ride along the tracks such that the pod carrier remains substantially level as it rides along the tracks.

8. The apparatus of claim 1, wherein the one or more storage locations include a storage location that is located to a side of a load port and wherein the buffer includes a rotating mechanism configured to move the pod between one or more of the one or more load ports and the storage location by a rotational motion of the pod while maintaining the pod in a substantially level orientation during the rotational motion of the pod, wherein the buffer further comprises a translating mechanism configured to translate a different pod horizontally between the load port and the storage location located to a side of the load port, whereby the buffer is configured to move one pod by rotational motion and move a second pod by translational motion.

9. The apparatus of claim 1, wherein the buffer is configured to substantially simultaneously swap a first pod and second pod between a storage location proximate the front end of the tool and one of the load ports.

10. The apparatus of claim 9 wherein the buffer is configured to move the first pod by a rotational motion of the pod.

11. The apparatus of claim 9 wherein the buffer is configured to maintain the first pod in a substantially level orientation during the rotational motion of the pod.

12. The apparatus of claim 11 wherein the buffer includes a pod carrier and two or more pivot arms, wherein each pivot arm is pivotally attached at a first end to the pod carrier and pivotally at a second end to pivot point, wherein the pivot points are located such that the pivot arms remain substantially parallel to each other as they rotate.

13. The apparatus of claim 11 wherein the buffer includes a pod carrier and two or more tracks, wherein the two or more tracks include first and second tracks, wherein the first and second tracks respectively follow first and second substantially co-planar paths having substantially the same shape, wherein the pod carrier includes two or more bearings attached to the pod, the bearings being in substantially fixed positional relation with respect to each other, each bearing being adapted to ride in a different one of the first and second tracks, wherein the first and second paths are offset with respect to each other such that the pod carrier remains substantially level as it rides along the tracks.

14. The apparatus of claim 11 wherein the buffer includes a pod carrier and two or more tracks, wherein the two or more tracks include first and second tracks, wherein the first and second tracks respectively follow first and second substantially co-planar intersecting closed-loop paths having substantially the same shape, wherein the pod carrier includes two or more bearings, the bearings being in a substantially fixed positional relation with respect to each other, each bearing being adapted to ride in a different one of the first and second tracks, wherein the first and second paths are offset with respect to each other, whereby the pod carrier is constrained to ride along the tracks such that the pod carrier remains substantially level as it rides along the tracks.

15. The apparatus of claim 9 wherein the one or more storage locations include a storage location that is located to a side of one of the load ports and wherein the buffer includes a rotating mechanism configured to move the pod between one or more of the one or more load ports and the storage location by a rotational motion of the pod while maintaining the pod in a substantially level orientation during the rotational motion of the pod, wherein the buffer further comprises a translating mechanism configured to translate a different pod horizontally between the load port and the storage location located to the side of the load port, whereby the buffer is configured to move one pod by rotational motion of the pod and move a second pod by translational motion.

16. The apparatus of claim 1 wherein the materials processing tool is a wafer processing tool.

17. The apparatus of claim 16 wherein the wafer-processing tool is a metrology tool, wafer surface inspection tool, or thin film metrology tool.

18. The apparatus of claim 1 wherein the materials pod is a front opening universal pod (FOUP).

19. The apparatus of claim 1 wherein the tool includes two or more load ports side-by-side.

20. The apparatus of claim 19 wherein the tool includes three or more load ports side-by-side, with a first load port situated between second and third load ports, wherein a first movable buffer is located adjacent the second load port and a second movable buffer is located adjacent the third load port.

21. The apparatus of claim 1 wherein one or more of the storage locations includes a tag reader configured to read information from a tag on the materials pod and provide information to a system controller.

22. A method for reducing the load on an automated material handling system during processing of materials in a system having one or more a materials processing tools with a front end with one or more load ports and one or more storage locations adapted to receive one or more materials pod from the automated material handling system, the method comprising the steps of:
receiving the one or more materials pods from one or more of the one or more storage locations, wherein each of the one or more storage locations is level with a corresponding one of the one or more load ports, and wherein each of the one or more storage locations is arranged in line abreast with a corresponding one of the one or more load ports;
moving one of the one or more pods with a movable buffer having a translation mechanism for translating the one or more pods from the one or more storage locations to the corresponding one of the one or more load ports by direct translation parallel to the front end while supporting the one or more pods from below, and/or;
receiving one or more pods from one or more of the one or more load ports and moving the one or more pods from the load port to the corresponding one of the one or more of the storage locations with the moveable buffer by horizontal translation, while supporting the one or more pods from below,
wherein the one or more pods are supported from below and accessible by the material handling system while at any of the one or more storage locations at the front end without having to move a pod with the buffer.

23. The method of claim 22 wherein moving the one or more pods with the buffer to one or more of the one or more load ports, and/or; receiving one or more pods from one or more of the one or more load ports and moving the one or more pods to one or more storage locations with the moveable buffer includes moving a pod by a rotational motion of the pod.

24. The method of claim 23 further comprising maintaining the pod in a substantially level orientation during the rotational motion of the pod.

25. The method of claim 24 wherein maintaining the pod in a substantially level orientation during the rotational motion includes the use of a pod carrier and two or more pivot arms, wherein each pivot arm is pivotally attached at a first end to the pod carrier and pivotally attached at a second end to pivot point, wherein the pivot points are located such that the pivot arms remain substantially parallel to each other as they rotate.

26. The method of claim 24 wherein maintaining the pod in a substantially level orientation during the rotational motion includes the use of a pod carrier and two or more tracks, wherein the two or more tracks include first and second tracks, wherein the first and second tracks respectively follow first and second substantially co-planar paths having substantially the same shape, wherein the pod carrier includes two or more bearings, the bearings being in substantially fixed positional relation with respect to each other, each bearing being adapted to ride in a different one of the first and second tracks, wherein the first and second paths are offset with respect to each other such that the pod carrier remains substantially level as it rides along the tracks.

27. The method of claim 23 further comprising translating a different pod horizontally between a load port and one of the one or more storage locations located to a side of the load port, whereby one pod moves by rotational motion another pod moves by translational motion.

28. The method of claim 22, wherein moving the one or more pods with the buffer includes simultaneously swapping a first pod and second pod between a storage location proximate the front end of the tool and one of the load ports.

29. The method of claim 28 wherein swapping the first pod and second pods includes moving the first pod by a rotational motion of the first pod.

30. The method of claim 29 wherein moving the first pod by a rotational motion of the first pod includes maintaining the first pod in a substantially level orientation during the rotational motion of the first pod.

31. The method of claim 30 wherein maintaining the first pod in a substantially level orientation during the rotational motion includes the use of a pod carrier and two or more pivot arms, wherein each pivot arm is pivotally attached at a first end to the pod carrier and pivotally at a second end to pivot point, wherein the pivot points are located such that the pivot arms remain substantially parallel to each other as they rotate.

32. The method of claim 30 wherein maintaining the first pod in a substantially level orientation during the rotational motion of the pod includes the use of a pod carrier and two or more tracks, wherein the two or more tracks include first and second tracks, wherein the first and second tracks respectively follow first and second substantially co-planar paths having substantially the same shape, wherein the pod carrier includes two or more bearings attached to the pod, the bearings being in substantially fixed positional relation with respect to each other, each bearing being adapted to ride in a different one of the first and second tracks, wherein the first and second paths are offset with respect to each other such that the pod carrier remains substantially level as it rides along the tracks.

33. The method of claim 28 wherein swapping the first pod and second pods includes translating a different pod horizontally between a load port and storage location located to a side of the load port, whereby one pod moves by rotational motion of the pod and another pod moves by translational motion.

34. The method of claim 22 further comprising notifying a system controller that a pod is located the storage location.

35. A method for reducing the load on an automated material handling system during processing of materials in a system having one or more cars for delivering materials pods to a materials processing tool, wherein the tool includes a front end with one or more load ports and one or more storage locations adapted to receive a materials pod from the automated material handling system, wherein each of the one or more storage locations is level with a corresponding one of the one or more load ports, and wherein each of the one or more storage locations is arranged in line abreast with a corresponding one of the one or more load ports the method comprising the steps of:
after a tool has finished processing a materials pod, moving the finished pod from a load port of the tool to a storage location at the front end proximate the load port using a moveable buffer attached to the front end of the tool by direct translation parallel to the front end, while supporting the pod from below;
delivering a new materials pod to the load port using the one or more cars; and
collecting the finished pod from the storage location with the one ore more cars,
wherein the pod is accessible by the material handling system while at any storage location at the front end without having to move the pod with the buffer.

36. The method of claim 35 wherein the one or more cars are unidirectional cars.

37. The method of claim 35 wherein the one or more cars are bi-directional cars.

38. The method of claim 35, further comprising delivering the finished pod to another tool or delivering the finished pod to storage using the one ore more cars.

39. The method of claim 35 wherein the automated material handling system is an overhead track system.

40. The method of claim 35, wherein delivering a new materials pod to the load port occurs after a tool has finished processing a materials pod.

41. The method of claim 35, wherein delivering a new materials pod to the load port occurs before a different tool has finished processing a materials pod.

42. The method of claim 41 further comprising, substantially simultaneously with moving the finished pod from the load port to the storage location, moving the new pod from the storage location to the load port.

43. A method for reducing the load on an automated material handling system during processing of materials in a system having one or more cars for delivering materials pods to a materials processing tool, the method comprising the steps of:
delivering a new pod to a storage location proximate a load port of the tool using the one or more cars, wherein the tool includes a front end with one or more load ports and one or more storage locations adapted to receive a materials pod from the automated material handling system, wherein each of the one or more storage locations is level with a corresponding one of the one or more load ports, and wherein each of the one or more storage locations is arranged in line abreast with a corresponding one of the one or more load ports;
collecting a finished pod from the load port with the one or more cars while supporting the finished pod from below; and
moving the new pod from the storage location to the load port using a moveable buffer attached to the front end of the tool by direct translation parallel to the front end while supporting the new pod from below,
wherein the new pod is supported from below and accessible by the material handling system while at any storage location at the front end of the tool without having to move the new pod with the buffer.

44. The method of claim 43 wherein the one or more cars are unidirectional cars.

45. The method of claim 43 wherein the one or more cars are bi-directional cars.

46. The method of claim 43, further comprising delivering the finished pod to another tool or delivering the finished pod to a storage using the one ore more cars.

47. The method of claim 43 wherein the automated material handling system is an overhead track system.

48. The method of claim 43, wherein delivering a new pod to a storage location occurs after a tool has finished processing a materials pod.

49. The method of claim 43, wherein delivering a new pod to a storage location occurs before a tool has finished processing a materials pod.

50. The method of claim 49 further comprising, substantially simultaneously with moving the new pod from the storage location to the load port, moving the finished pod from the load port to the storage location.

51. The method of claim 43 further comprising notifying a system controller that a pod is located the storage location.

* * * * *